United States Patent [19]

Asano et al.

[11] Patent Number: 5,128,744
[45] Date of Patent: Jul. 7, 1992

[54] SEMICONDUCTOR INTEGRATED CIRCUIT AND METHOD OF MANUFACTURING SAME

[75] Inventors: Isamu Asano; Hideo Aoki, both of Ohme, Japan

[73] Assignee: Hitachi, Ltd., Tokyo, Japan

[21] Appl. No.: 406,062

[22] Filed: Sep. 12, 1989

[30] Foreign Application Priority Data

Sep. 12, 1988 [JP] Japan .................. 63-227995

[51] Int. Cl.⁵ .................. H01L 29/68; H01L 29/34; H01L 29/06; H01L 23/48
[52] U.S. Cl. .................. 357/54; 357/55; 357/71; 357/23.6
[58] Field of Search .................. 357/71, 23.6, 54, 55

[56] References Cited

U.S. PATENT DOCUMENTS

| | | | |
|---|---|---|---|
| 4,283,439 | 8/1981 | Higashinakagawa et al. | 427/89 |
| 4,398,335 | 8/1983 | Lehrer | 357/71 |
| 4,732,801 | 3/1988 | Joshi | 437/241 |
| 4,800,177 | 2/1989 | Nakamae | 437/200 |
| 4,816,895 | 3/1989 | Kikkawa | 357/71 |
| 4,847,674 | 7/1989 | Sliwa | 357/67 |
| 4,851,295 | 7/1989 | Brors | 437/200 |
| 4,907,066 | 3/1990 | Thomas et al. | 357/54 |

FOREIGN PATENT DOCUMENTS

| | | | |
|---|---|---|---|
| 55-095340 | 7/1980 | Japan | 357/54 |
| 63-43349 | 2/1988 | Japan | 357/54 |
| 63-117447 | 5/1988 | Japan | 357/54 |

OTHER PUBLICATIONS

Oberai, "Single Masking for Emitter-Base Diffusion," IBM Tech. Discl. Bulletin, p. 387, Jul. 1971.
Arnett, "Three-Dimensional Dual Insulator Memory", IBM Tech. Discl. Bulletin, p. 3517-3518, Apr. 1974.
Bilous, "Multilevel Wiring for Integrated Circuits," IBM Tech. Discl. Bulletin, pp. 429-430, Jul. 1970.

Primary Examiner—Andrew J. James
Assistant Examiner—Carl Whitehead, Jr.
Attorney, Agent, or Firm—Antonelli, Terry, Stout & Kraus

[57] ABSTRACT

In a semiconductor integrated circuit device having a fine multilayer interconnection structure, a wiring material such as tungsten is formed on a predetermined part of the interior of a wiring layer-forming groove formed in a flat inter-layer insulating film by selective deposition. The flat inter-layer insulating film has a laminate structure of two or more insulating films different in etching speed, and a (first) insulating film, underlying a (second) insulating film in which the wiring layer-forming groove of the inter-layer insulating film is formed, serves as an etching stopper to make the depth of the wiring layer-forming groove constant when forming the groove from etching. Consequently, the depth of the wiring layer-forming groove can be defined accurately by the thickness of a (second) insulating film formed by deposition, and the film thickness between wiring layers can be accurately defined by the thickness of an insulating film formed by deposition.

34 Claims, 14 Drawing Sheets

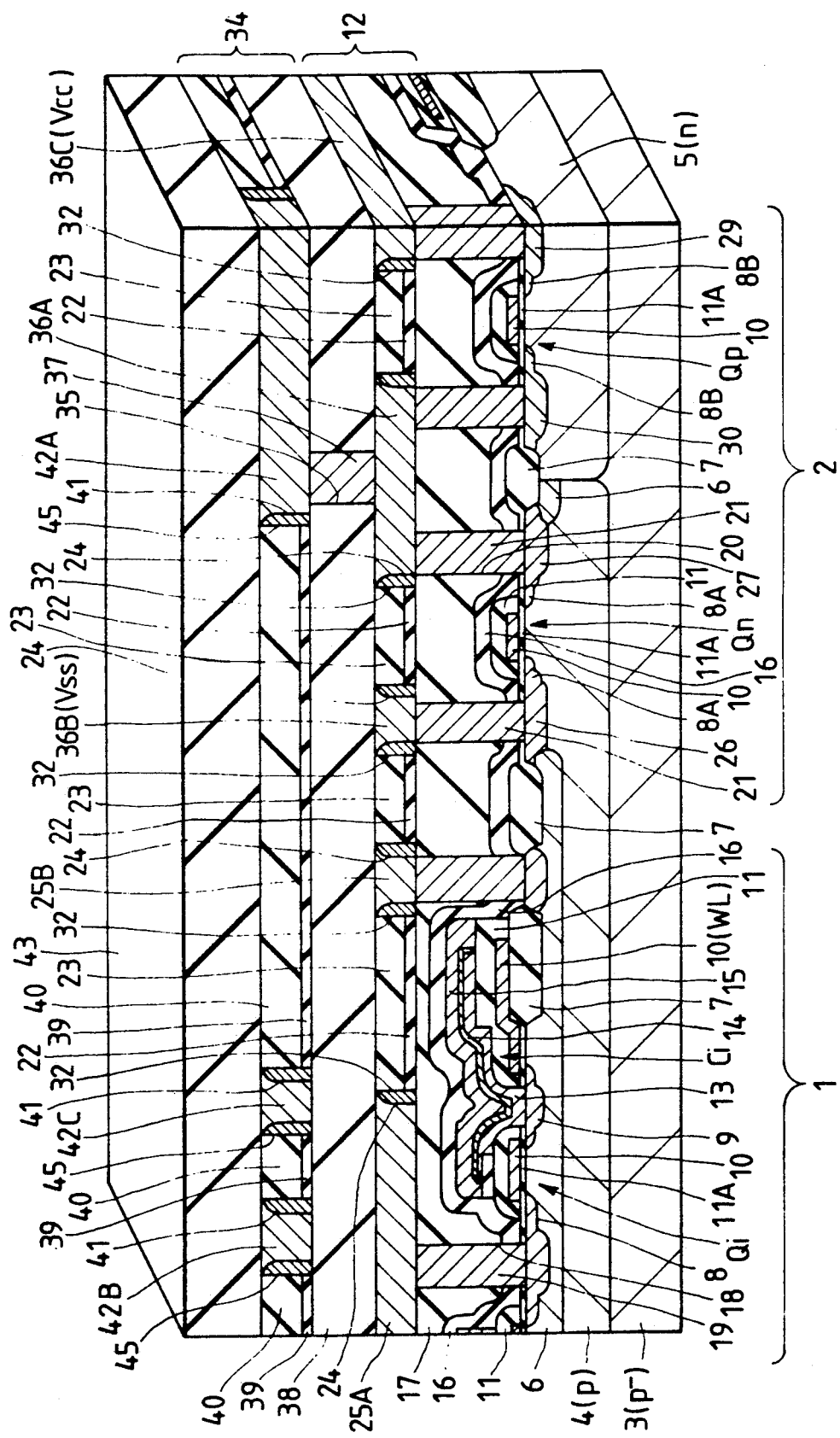

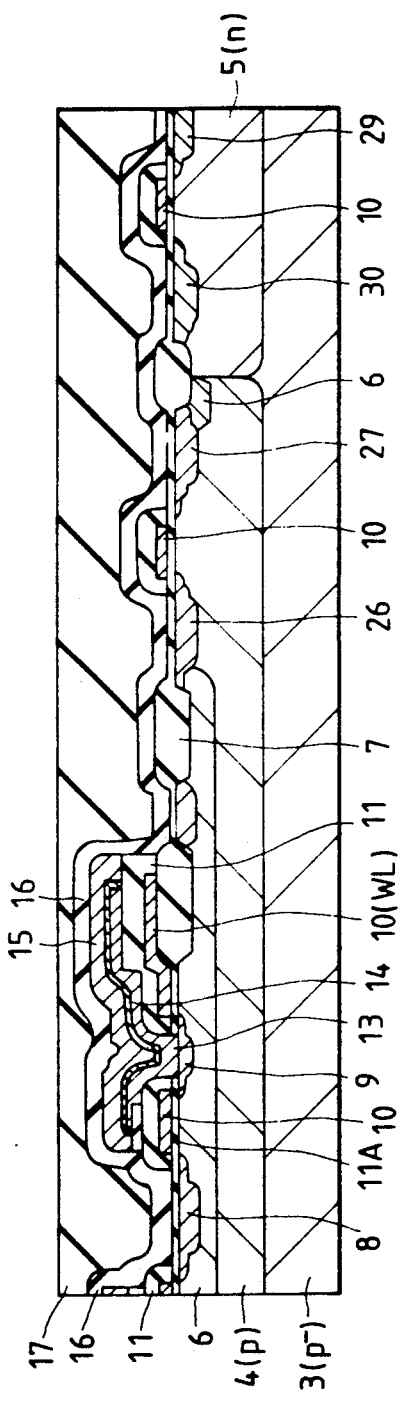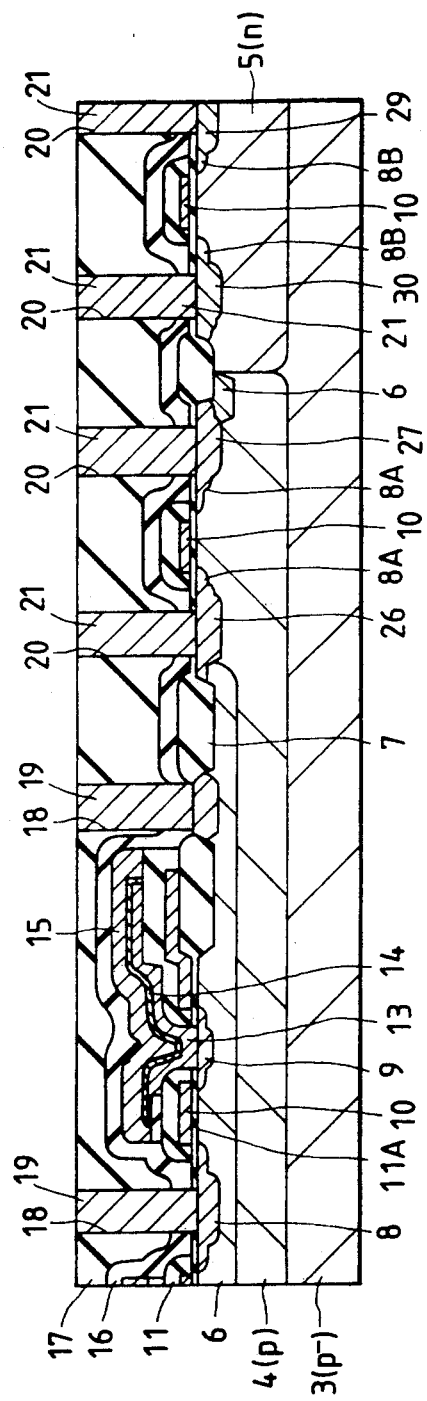

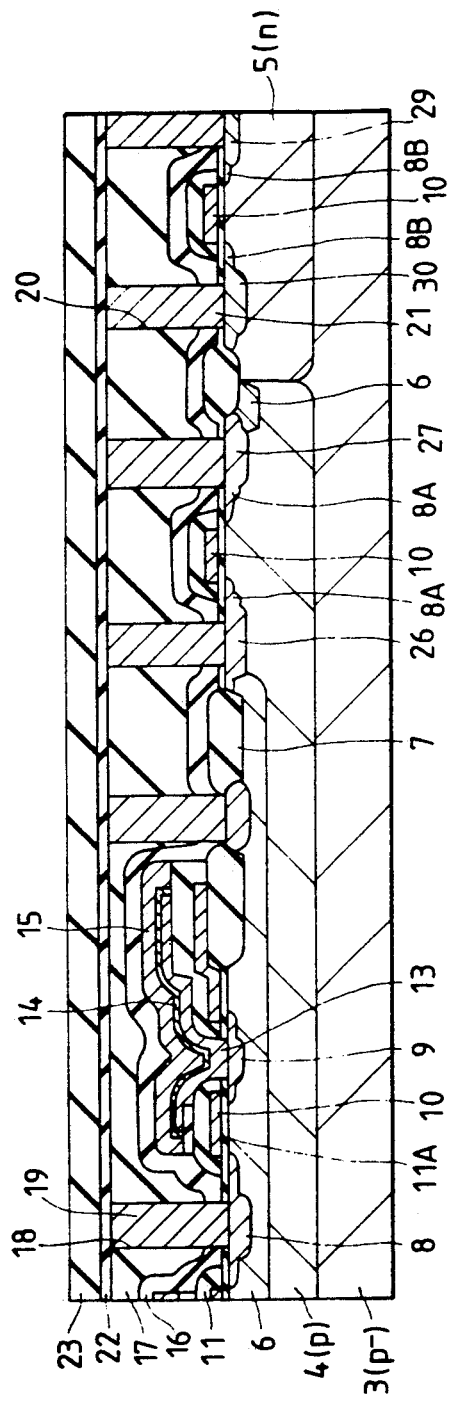
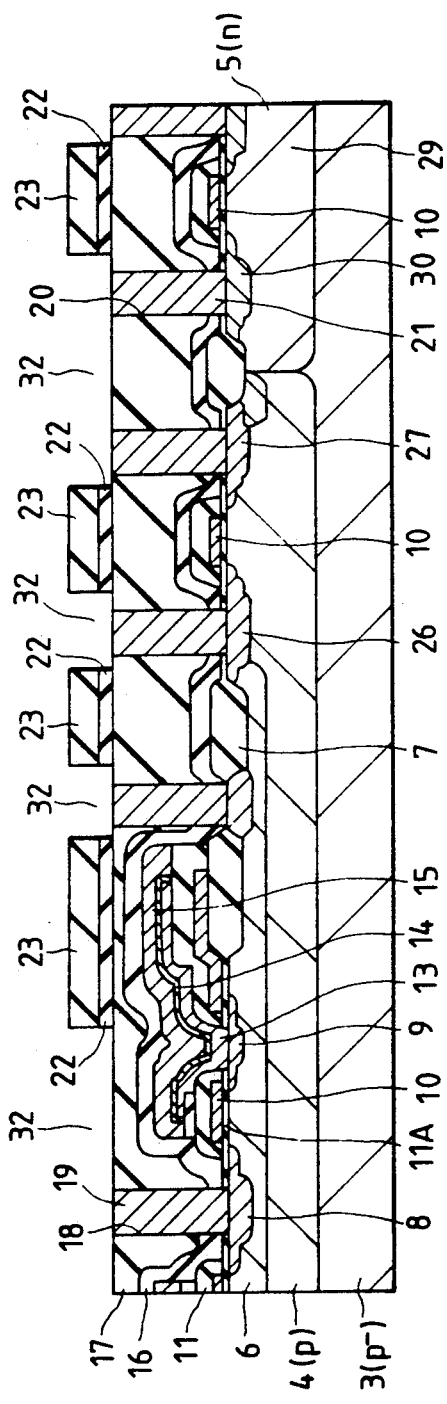
FIG. 2(c)
FIG. 2(d)

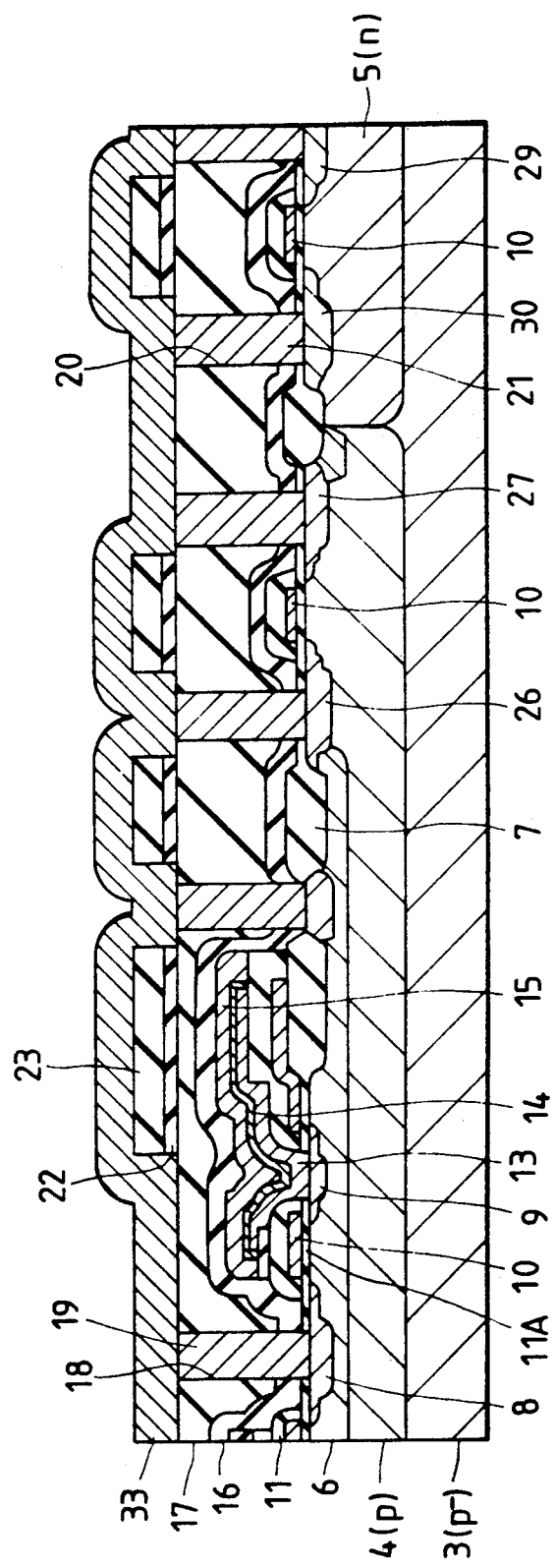

SEMICONDUCTOR INTEGRATED CIRCUIT AND METHOD OF MANUFACTURING SAME

BACKGROUND OF THE INVENTION

The present invention relates to a semiconductor integrated circuit, and particularly to a technique useful in its application to a semiconductor integrated circuit device having a fine multilayer interconnection.

The structure of the multilayer interconnection generally adopted at present is as follows: A metallic layer, such as an aluminum layer, formed by deposition on an insulating film having contact holes in predetermined positions is etched into a desired pattern to form a first wiring layer. An inter-layer insulating film having a through-hole in a predetermined position is formed on the first wiring layer and the insulating film. A second wiring layer is formed by etching a metallic layer, such as an aluminum layer, formed by deposition on the inter-layer insulating film so as to make contact with the first wiring layer through the through-hole. Further, a second inter-layer insulating film is formed on the second wiring layer. Thereafter, the same construction is repeated to constitute a multilayer interconnection. With higher integration, namely decreasing the size of circuit components, the wiring layer width becomes narrower, resulting in marked disconnection caused by electromigration. To avoid this inconvenience, there has been adopted a technique of enhancing the resistance to electromigration by replacing aluminum as the wiring layer-forming metal with a metal, e.g. tungsten, having a melting point higher than that of aluminum.

As a literature describing tungsten wiring there is mentioned VLSI Multilevel Interconnection. Conf. No. 86CH23374, p. 418 (1986).

SUMMARY OF THE INVENTION

In the above multilayer interconnection structure, concavities and convexities are formed on the inter-layer insulating film overlying a wiring layer pattern in accordance with the wiring layer pattern which has predetermined height and width. These concavities and convexities in turn cause the formation of like concavities and convexities on the overlying wiring layer and inter-layer insulating film. Further, in the contact hole and through-hole portions the wiring layer itself has concavities.

Once such concavities and convexities are formed on the wiring layer itself, the resulting stepped portions of the wiring layer become thin to an undesirable extent, thus not only inducing disconnection by electromigration but also causing a step coverage defect at the time of covering the wiring layer with an inter-layer insulating film, because the wiring pitch becomes narrower with decreasing size of circuit components.

Moreover, the presence of concavities and convexities on the surface of a semiconductor pellet caused by the concavities and convexities on the wiring layer and insulating film makes it difficult to form a CCB (Controlled-Collapsed-Bonding) structure for direct mounting of a semiconductor pellet on the wiring substrate through a bump such as a solder ball formed on a pad electrode at the surface of the semiconductor pellet.

Further, in forming the above multilayer interconnection, the wiring layer width is apt to decrease to a size less than the width between the openings of a photoresist film which serves as a mask in the wiring pattern formation, due to an overetching phenomenon, particularly side etching, so the resistance to electromigration becomes weaker, resulting in deteriorated reliability of the semiconductor integrated circuit.

The resistance to electromigration of the wiring layer may be enhanced by using tungsten as the wiring layer-forming metal, but when tungsten is deposited, there are formed surface concavities and convexities as large as 0.1 $\mu$m, and thus its processability is poor; besides, its adhesion to the insulating film is weak and therefore exfoliation of the wiring layer is apt to occur.

It is an object of the present invention to provide a technique capable of improving the reliability of a semiconductor integrated circuit device having a multilayer interconnection structure.

It is another object of the present invention to provide a technique capable of decreasing the size of a multilayer interconnection structure and thereby improving the packaging rate of wiring in a semiconductor integrated circuit device having a multilayer interconnection structure.

It is a further object of the present invention to provide a technique capable of attaining the above objects by flattening wiring layers and inter-layer insulating films.

It is a still further object of the present invention to provide a semiconductor integrated circuit device of high reliability with no likelihood of wiring exfoliation.

The above and other objects and novel features of the present invention will become apparent from the following description and the accompanying drawings.

The present invention will be outlined below. This outline is illustrative of the present invention, and not limiting.

In a semiconductor integrated circuit device having a multilayer interconnection structure, a wiring material such as, for example, tungsten is deposited in a wiring layer-forming groove formed in substantially a flat inter-layer insulating film to form a wiring layer almost flush with the inter-layer insulating film (the wiring layer having a top surface that is substantially co-planar with a top surface of the inter-layer insulating film). Further, a base layer for selective deposition of the wiring layer, e.g. tungsten, is formed beforehand in the wiring-forming groove. Under the insulating film portion for forming the wiring layer-forming groove the inter-layer insulating film has an insulating film portion different in etching speed from the insulating film portion for the formation of the groove.

According to the above means, by embedding the wiring layer such as tungsten layer into the wiring layer-forming groove formed in substantially the flat inter-layer insulating film, it is possible to eliminate the difference in height and the decrease in width of the wiring layer. As a result, it is possible to eliminate a step coverage defect or disconnection caused by electromigration and improve the reliability of the semiconductor integrated circuit device.

Moreover, since the base layer for selective deposition of the wiring material such as tungsten in formed beforehand in the wiring layer-forming groove, it is possible to enhance the groove-wiring layer adhesion, thus making it possible to eliminate wiring exfoliation and improve the reliability of the semiconductor integrated circuit device.

Further, the (first) insulating layer, formed under the (second) insulating layer of the inter-layer insulating film, the wiring layer-forming groove being formed in the (second) insulating layer, is lower in etching speed than the (second) insulating layer, and serves as a stopper to keep the groove depth constant at the time of forming the wiring layer-forming groove by etching, thereby preventing overetching of the underlying insulating layer and facilitating control for the depth of the groove. By use of such (first) and (second) insulating layers, it is also possible to decrease the size of a multilayer interconnection structure and to make the process margin large.

BRIEF DESCRIPTION OF THE DRAWINGS

FIG. 1 is a longitudinal sectional view of a principal portion showing a construction of a memory cell of a DRAM (Dynamic-Random-Access-Memory) according to an embodiment I of the present invention;

FIGS. 2(a) to 2(i) are sectional views of a p portion, showing the memory cell of the DRAM of FIG. 1 at various stages of the manufacturing process;

DESCRIPTION OF THE PREFERRED EMBODIMENTS

Figure 2F:
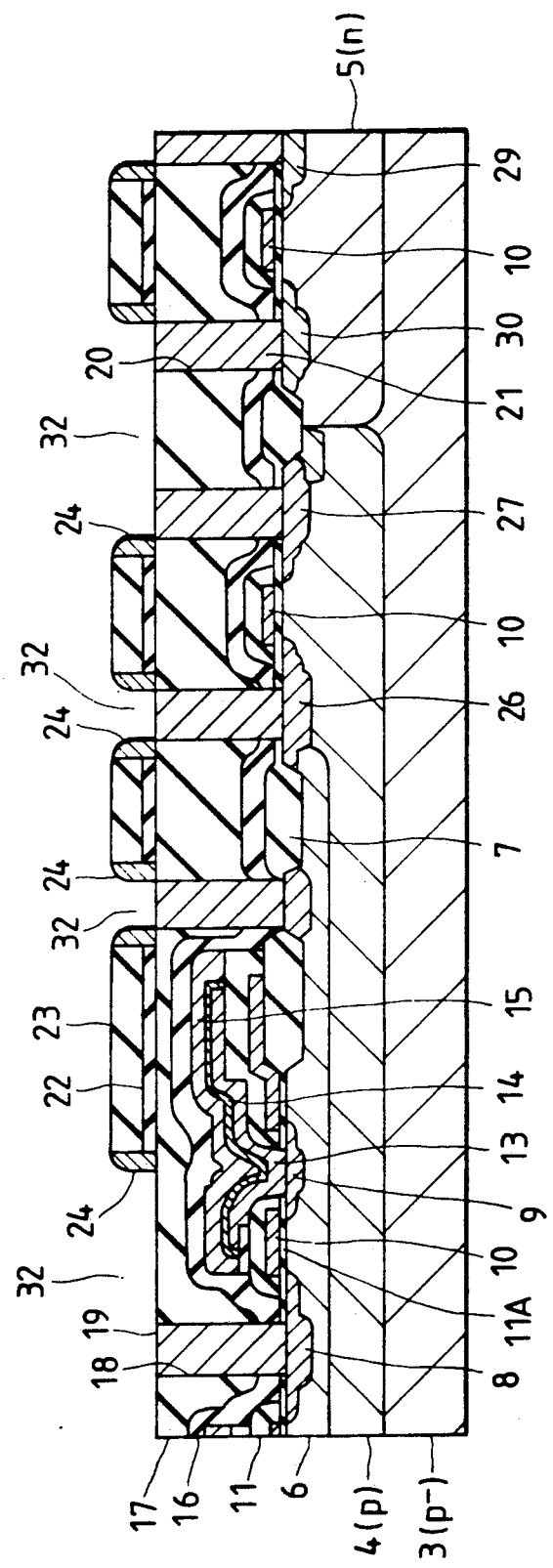

In all of the drawings for illustration of the embodiments, components having the same functions are indicated by the same reference numerals, and repeated explanations will be omitted.

Embodiment I

A DRAM having a multilayer interconnection structure according to an embodiment I of the present invention is illustrated in FIG. 1 (a longitudinal sectional view of a principal portion). The left-hand side of FIG. 1 is the section of a memory cell-forming region 1, while the right-hand side thereof is the section of a CMIS (Complementary-Metal-Insulator-Semiconductor) which constitutes a peripheral circuit formed on a peripheral circuit-forming region 2. The DRAM is constituted by a p-type semiconductor substrate 3 formed of a single crystal silicon. On major surface portions of the memory-forming region 1 and an n-channel MISFET (MIS Field Effect Transistor) Qn-forming region of the semiconductor substrate 3 there is formed a p-type well region 4. On a p-channel MISFET-forming region Qp of the semiconductor substrate 3 there is formed an n-type well region 5. Thus, the DRAM of this embodiment adopts a twin well structure.

On the major surface between semiconductor element-forming areas of the well regions 4, 5 there is provided an inter-element isolating insulation film (field insulation film) 7, which is constituted for electrical isolation between semiconductor elements. Below the inter-element isolating insulation film 7 and on the major surface portion of the well region 4 there is formed a p-type semiconductor region 6, which region covers substantially the whole surface of the memory cell-forming region.

Each memory cell formed on the memory cell-forming region 1 is not specially limited, but in this embodiment it is a one-transistor type memory cell, which comprises a memory cell selecting MISFET Qi and a capacitor Ci for information storage. The memory cell selecting MISFET Qi is principally composed of a pair of n-type semiconductor regions 8 which are each either a source region or a drain region, a gate electrode 10 and a gate insulating film 11A. The gate insulating film 11A is a silicon oxide film formed by oxidizing the major surface of the well region 4. The gate electrode 10, formed on the gate insulating film 11A, is a polycrystalline silicon film formed by deposition according to, for example, CVD (Chemical-Vapor-Deposition). In this polycrystalline silicon film there is incorporated an n-type impurity (phosphorus or arsenic) for reducing the resistance value.

The gate electrode 10 may be constituted by a film of a single metal that melts at high temperatures (Mo, Ti, Ta, or W), or a film of a single metal silicide (MoSi$_2$, TiSi$_2$, TaSi, or WSi$_2$) of such metal that melts at high temperatures. Or it may be a composite film formed by laminating any of the above metallic films onto a polycrystalline silicon film. The gate electrode 10 is formed integrally with a word line (WL) 10; that is, the gate electrode 10 and the word line 10 are constituted by the same electroconductive layer. Further, the gate electrode 10 is covered with an insulating film 11 which preferably is a silicon oxide film.

The information storage capacitor Ci of the memory cell is constituted principally by laminating a first electroconductive layer (lower electrode layer) 13, a dielectric film 14 and a second electrode layer (upper electrode layer) 15 successively in this order. The information storage capacitor Ci is constituted by a stacked structure. The first electrode layer 13 is preferably a polycrystalline silicon film which incorporates therein, for example, an n-type impurity (arsenic or phosphorus) in high concentration for reducing the resistance value. The dielectric film 14 is, illustratively, basically of a two-layer structure constituted by a laminate of a silicon nitride film formed by deposition on the first electroconductive layer 13 by CVD and a silicon oxide film obtained by oxidizing the silicon nitride film at a high pressure, as is conventional in the art. The second electrode layer 15 is formed over the first electrode layer 13 through the dielectric film 14. The second electrode layer 15 is formed integrally with the second electrode layer 15 in the information storage capacitor Ci of another memory cell M adjacent thereto. The second electrode layer 15 is constituted so that supply voltage of ½ Vcc (reference voltage Vcc−5[V]) can be applied thereto. For example, the second electrode layer 15 is a polycrystalline silicon film having incorporated therein an n-type impurity for reducing the resistance value.

The CMIS which constitutes the peripheral circuit is illustratively shown on the right-hand side of FIG. 1. The n-channel MISFET Qn of the CMIS is formed on the major surface portion of the well region 4 in the area surrounded with the p-type semiconductor region 6 and the inter-element isolating insulation film 7. The MISFET Qn is composed principally of the well region 4, a pair of n-type semiconductor regions 8A which are each either a source region or a drain region, a gate electrode 10 and a gate insulating film 11A.

The p-channel MISFET Qp of the CMIS is formed on the major surface portion of the well region 5 in the area surrounded with the inter-element isolating insulation film 7. It is composed principally of the well region 5, a pair of p-type semiconductor regions 8B which are each a source region or a drain region, a gate electrode 10 and a gate insulating film 11A.

The structure of the above memory cell is described in U.S. Ser. No. 246,514, filed on Sept. 19, 1988, the contents of which are incorporated herein by reference.

The DRAM of this embodiment has a two-layer wiring structure of tungsten.

On the memory cell and the peripheral CMIS circuit there are formed a first inter-layer insulating film 12 and substantially a flat, first wiring layer which includes a tungsten silicide (WSi$_2$) layer 24 and first tungsten wiring layers 25A, 25B, 36A–36C. Then, over the first inter-layer insulating film 12 and the first wiring layer there are formed a second inter-layer insulting film 34 and substantially a flat, second wiring layer which includes a tungsten silicide (WSi$_2$) layer 41 and second tungsten wiring layers 42A–42C.

The first inter-layer insulating film 12 is composed of an insulating film (silicon oxide film) 16, a flatwise-covered BPSG (Boron-doped Phospho-Silicate Glass) film (first insulating film) 17, an overlying nitride film (second insulating film) 22 and an overlying silicon oxide film (third insulating film) 23, which cover the memory-forming region 1 and the peripheral circuit-forming region 2.

The BPSG film 17 is formed so that its surface can be flattened by the application of glass flow thereto, as known in the art.

The silicon oxide film 16 is provided for ensuring isolation voltage and for preventing the boron and phosphorus incorporated in the upper BPSG film 17 from leaking to the semiconductor element.

In the memory cell-forming region 1, a plurality of contact holes 18 are formed in predetermined positions of the insulating film 16 and the BPSG film 17, and in the interior of each contact hole 18 there is formed a tungsten electrode 19 which is flush with the BPSG film 17.

Also in the peripheral circuit-forming region 2, a plurality of contact holes 20 are formed in predetermined positions of the insulating film 16 and the BPSG film 17, and a tungsten electrode 21 is formed in the interior of each contact hole 20.

For circuitwise connection of the above tungsten electrodes, predetermined portions of the nitride film 22 and the silicon oxide film 23 are removed in advance to form wiring layer-forming grooves 32, in which are embedded the first tungsten wiring layers 25A, 25B and 36A–36C so as to be substantially flush with the surface of the silicon oxide film 23. Further, a tungsten silicide (WSi$_2$) layer 24 is located on each of the side faces of the first tungsten wiring layers 25A, 25B, 36A–36C, which tungsten silicide (WSi$_2$) layer 24 functions to maintain good adhesion between the first tungsten wiring layer and the nitride film 22, silicon oxide film 23. The process for forming the tungsten silicide (WSi$_2$) layer 24 will be described later. This layer is selectively formed on the side faces of the nitride film 22 and silicon oxide film 23 by patterning, for example by etching back (e.g., by RIE (Reactive-Ion-Etching)) a tungsten silicide film formed by sputtering or CVD.

To one semiconductor region 8 of the MISFET Qi is connected a data line 25A formed by the first tungsten wiring layer through a tungsten electrode 19.

To the semiconductor region 8A used as the source region of the n-channel MISFET Qn of the CMIS which constitutes the peripheral circuit there is connected the first tungsten wiring layer 36B to which is applied a reference voltage Vss through a tungsten electrode 21. To the semiconductor region 8A used as the drain region of this n-channel MISFET Qn there is connected the first tungsten wiring layer 36A for an output signal through a tungsten electrode 21.

Further, to the semiconductor region 8B used as the source region of the p-channel MISFET Qp of the CMIS which constitutes the peripheral circuit there is connected the first tungsten wiring layer 36C to which is applied the supply voltage Vcc.

The second inter-layer insulating film 34, formed on the first inter-layer insulating film, is composed of a silicon oxide film 38 (second-layer first insulating film), a nitride film 39 (second-layer second insulating film) and a silicon oxide film 40 (second-layer third insulating film).

Where required in circuit configuration, wiring layer-forming grooves 45 are formed in predetermined positions of the silicon oxide film 38 and the nitride film 39, and the second tungsten wiring layers 42A–42C are embedded in the wiring layer-forming grooves 45 so as to be substantially flush with the surface of the silicon oxide film 40.

A tungsten silicide layer (WSi$_2$) 41 is located on the side face of each second tungsten wiring layer 42 for maintaining good adhesion to the nitride film 39 and silicon oxide film 40. The connection between the first tungsten wiring layer 36A for output signal and the second tungsten wiring layer 42A for output signal is made through a tungsten electrode 37 deposited selectively in a through-hole 35 formed in the silicon oxide insulating film 38 and flush with the silicon oxide film 38.

The second tungsten wiring layers 42B and 42C constitute word lines for shunt.

On the second inter-layer insulating film 34 and the second tungsten wiring layer 42 there is formed a passivation film 43. For example, the passivation film 43 may be a PSG (Phospho-Silicate Glass) film deposited by CVD.

The tungsten wiring layer forming process in the structure shown in FIG. 1 will be described below with reference to FIGS. 2(a) to 2(i).

First, as shown in FIG. 2(a), insulating film 16 is formed on a semiconductor element which has been formed on the semiconductor substrate 3 through predetermined steps known in the art, and then a BPSG film 17 is formed on the insulating film 16. For example, the insulating film 16 is a silicon oxide film deposited by CVD and having a thickness of about 0.5–15μ. The surface of the BPSG film 17 is flattened, for example, by the application of glass flow thereto after its formation by CVD, as known in the art. The glass flow is performed, for example, by annealing at a temperature of 1,000° C.

Next, as shown in FIG. 2(b), contact holes 18 and 20 are formed, for example by anisotropic dry etching such as reactive ion etching (RIE), in predetermined positions on the semiconductor regions 8, 8A and 8B of the semiconductor element formed on the semiconductor substrate. This anisotropic dry etching process can use, for example, conventional photoresist, in a conventional photolithography technique, to mask the substrate except for the location of the predetermined positions where the contact holes are formed.

Then, tungsten electrodes 19 and 21 are formed in the interiors of the contact holes 18 and 20 by a selective CVD method. The tungsten electrodes 19 and 21 are formed by CVD (selective CVD) under the conditions of a substrate temperature of 250°–350° C. and a pressure of 100-500 mm Torr in an atmosphere in which the monosilane (SiH$_4$) to tungsten hexafluoride (WF$_6$) gas flow ratio (volume ratio) is SiH$_4$/WF$_6$<1.6.

The selective metal CVD method is a technique wherein a metal is deposited selectively on the semiconductor substrate and the metal or metal silicide by CVD without deposition of the metal on the insulating films (silicon oxide films, etc.). This selective CVD technique is known in the art.

Next, as shown in FIG. 2(c), a nitride film 22 which, illustratively, is a silicon nitride film and has a thickness in the range of about 500 to about 1,500 Å is formed on the BPSG film 17. Then, a silicon oxide film 23 having a thickness of about 0.5-1$\mu$ is formed on the nitride film 22. For example, the silicon nitride film 22 is formed by plasma CVD under the conditions of a monosilane (SiH$_4$) to ammonia (NH$_3$) gas flow ratio (volume ratio) of 1:4, a substrate temperature of 300°-350° C. and a pressure of 1.5 Torr. The silicon oxide film 23 is formed, for example, by plasma CVD under the conditions of a monosilane (SiH$_4$) to nitrogen oxide (N$_2$O) gas flow ratio (volume ratio) of 1:4, a substrate temperature of 300°-400° C. and a pressure of 1.5 Torr.

Then, predetermined portions of the silicon nitride film 22 and silicon oxide film 23 are removed by plasma etching to form the wiring layer-forming grooves 32 shown in FIG. 2(d). The silicon oxide film 23 can be removed, for example, by plasma etching using CF$_4$+O$_2$ with N$_2$ added.

In removing the silicon oxide film 23, under the same etching conditions the silicon oxide film 23 is etched at a higher speed than that of the silicon nitride film 22 so that the silicon oxide film 23 is selectively removed. The silicon oxide film 23 can be provided with a mask, so that only the predetermined portions are removed by plasma etching, using conventional photoresist in a conventional photolithography technique. When the silicon oxide film 23 is removed, the etching condition is changed to remove the silicon nitride film 22 selectively.

Next, in removing the silicon nitride film 22, under the same etching conditions the silicon nitride film 22 is etched at a higher speed than that of the silicon oxide film 23 and the BPSG film 17, so when the nitride film 22 on the tungsten electrodes 19 and 21 is removed the etching reaction speed of the underlying BPSG film 17 becomes relatively low to prevent excessive etching of the BPSG film 17.

In other words, at the time of forming the wiring layer-forming grooves 32 by etching, the BPSG film 17 lower in etching speed than the nitride film 22 serves as a stopper to keep the groove depth constant. Consequently, the depth of the wiring layer-forming groove 32 can be accurately made equal to the thickness of the nitride film 22 plus the thickness of the silicon oxide film 23; besides, the dimensional margin for overetching can be reduced.

The state of progress of etching can be analyzed, for example, by monitoring a specific emission spectrum (emission spectrum of SiN, SiH and SiO, for instance).

Next, as shown in FIG. 2(e), a tungsten silicide (WSi$_2$) layer 33 is formed on the BPSG film 17 and the silicon oxide film 23 (illustratively, over the entire surface of the substrate). For example, the tungsten silicide (WSi$_2$) layer 33 is formed by CVD at a substrate temperature of 400°-450° C. in an atmosphere in which a monosilane (SiH$_4$) to tungsten hexafluoride (WF$_6$) gas flow ratio (volume ratio) is SiH$_4$/WF$_6$>20.

Next, as shown in FIG. 2(f), tungsten silicide (WSi$_2$) layer 33 is etched back throughout the whole surface thereof by, for example, plasma etching to form tungsten silicide (WSi$_2$) layers 24 along the side faces of each wiring-forming groove 32. Because of good adhesion to the silicon oxide film, the tungsten silicide (WSI$_2$) layers 24 not only serve as base films for the deposition of tungsten wiring layers by the selective CVD method in the next step but also function to enhance the adhesion between the tungsten wiring layers and the silicon oxide film.

The tungsten silicide (WSi$_2$) layers 24 may be formed so as to remain on the bottoms of the wiring layer-forming grooves 32. The tungsten silicide layers formed on the bottoms of the wiring layer-forming grooves 32 permit the tungsten wiring layers to be embedded more certainly into the plural grooves 32 having different wiring widths.

Figure 2G:
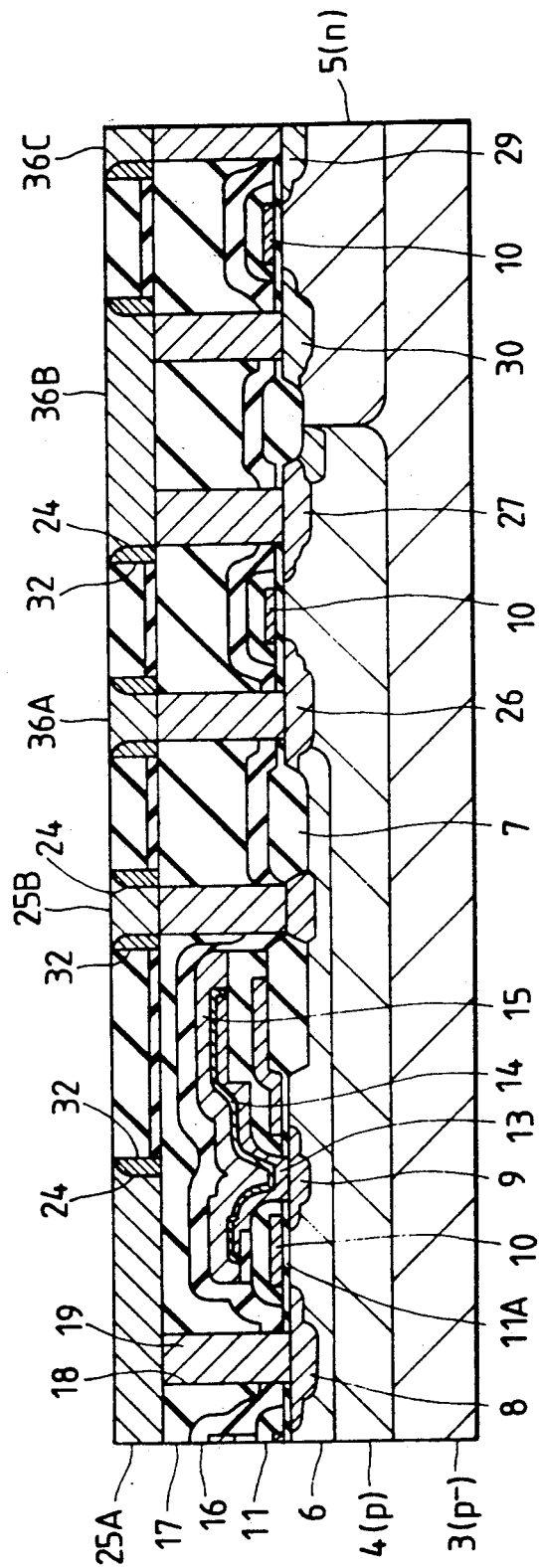

Then, as shown in FIG. 2(g), using the selective CVD method, the first tungsten wiring layers 25A, 25B and 36A-36C are formed in the wiring layer-forming grooves 32 so as to become substantially flush with the silicon oxide film 23. Although the adhesion of the tungsten wiring layers to the silicon oxide film is poor, the tungsten silicide layers 24 serving as base layers function to enhance the adhesion, so the tungsten wiring layers 25A, 25B and 36A-36C are prevented from being separated from the silicon oxide film 23.

Figure 2H:
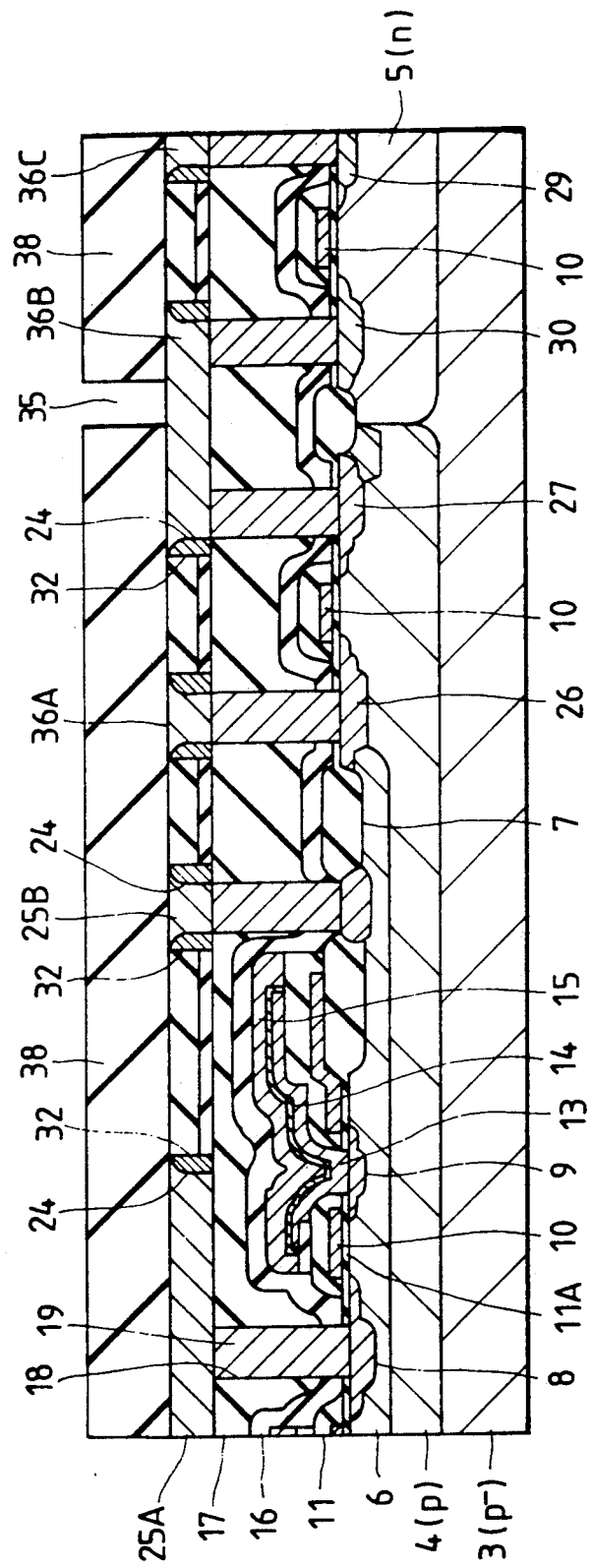

Then, as shown in FIG. 2(h), a silicon oxide film 38 having a thickness of about 1$\mu$ is formed on the silicon oxide film 23 and the first tungsten wiring layers 25A, 25B, 36A-36C.

Next, a through-hole 35 is formed in a predetermined position of the silicon oxide film 38 by anisotropic dry etching, e.g. RIE. Masking of the silicon oxide film 38 at locations other than the predetermined position can be achieved using conventional photoresist, in a conventional photolithography technique.

Next, a tungsten electrode 37 is formed in the interior of the through-hole 35 by the selective CVD method.

Then, in the same manner as in the step shown in FIG. 2(c), a nitride film 39 having a thickness of about 500-1,500 Å and a silicon oxide film 40 having a thickness of about 0.5-1.5$\mu$ are formed on the silicon oxide film 38.

Figure 2I:
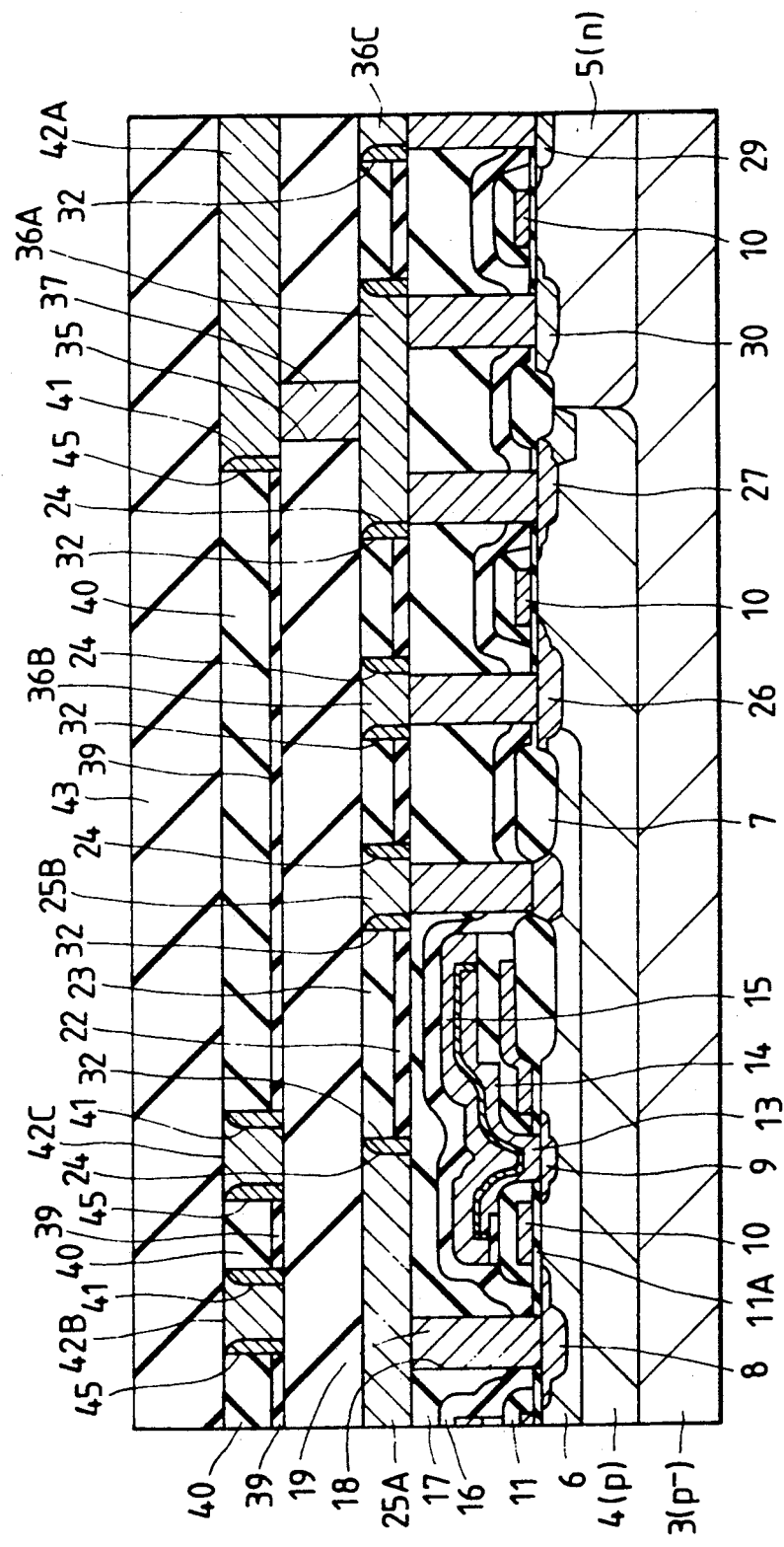

Next, in the same manner as in the steps shown in FIGS. 2(d) and 2(e), there are formed tungsten silicide (Wsi$_2$) layers 41 and second tungsten wiring layers 42A-42C. Then, a passivation film 43 is formed using phospho-silicate glass as shown in FIG. 2(i).

The DRAM of this embodiment I is completed through a series of manufacturing steps described above.

The following effects are attained by the above embodiment.

(1) In a semiconductor integrated circuit having a multilayer interconnection structure, there can be attained an essentially flat multilayer interconnection structure by embedding the tungsten wiring layers 25, 36 and 42 into the wiring layer-forming grooves 24 and 35 formed in substantially the flat inter-layer insulating films 12 and 34. Consequently, the pellet surface can be flattened and the formation of a CCB structure can be facilitated.

Moreover, since there are formed wiring layers having no difference in height, it is possible to prevent disconnection caused by electromigration which is conspicuous at stepped portions of wiring in the prior art, and also possible to prevent a step coverage defect caused by concavities and convexities in the wiring layers.

Further, in the above wiring layer embedding operation, since the wiring layers can be formed by a selective CVD method, it is possible to prevent the wiring width from being reduced undesirably by overetching, relative to the width between the openings of a conventional wiring pattern forming mask.

Additionally, since the tungsten silicide layers 24 and 41 are provided between the insulating films 22, 23, 39, 40 and the tungsten wiring layers 25, 36, 42, the adhesion between those insulating films and tungsten wiring layers is improved to the extent of eliminating the fear of separation, whereby it is possible to improve the reliability of the semiconductor integrated circuit device.

(2) In a semiconductor integrated circuit having a multilayer interconnection structure, the inter-layer insulating films 12 and 34 are constituted by laminate structures of the first insulating films 17, 38 and the second insulating films 22, 39, and the first insulating films 17 and 38 formed under the wiring layer-forming grooves 32 and 45 of the inter-layer insulating films 12 and 34, respectively, are lower in etching speed than the second insulating films 22 and 39.

Consequently, in forming the wiring layer-forming grooves 32 and 45 by etching, it is possible to reduce the overetching amount of the first insulating films 17 and 38, and hence the depth of the wiring layer-forming grooves 32 and 45 can be controlled with high accuracy.

Thus, since it is possible to reduce the dimensional margin for the amount of overetching, the depth of the wiring layer-forming groove 32 can be made equal accurately to the thickness of the second insulating film 22 plus the thickness of the third insulating film 23 which were formed by deposition, and also the depth of the wiring layer-forming groove 45 equal accurately to the thicknesses of the second and third insulating films 39, 40. At the same time, the film thickness between the first wiring layers 25, 36 and the second wiring layer 42 can be made equal accurately to the thickness of the first insulating film 38.

Consequently, it is possible to easily constitute a semiconductor integrated circuit device having a submicron order of a multilayer interconnection and having a high density and a high integration degree. Additionally, since the stress of the second insulating films 22 and 39 formed of silicon nitride is larger than that of the first insulating films 17 and 38 formed of silicon oxide, stress can be diminished by thinning the second insulating films 22 and 39, with the inter-layer insulating films 12 and 34 formed by a three-layer structure.

Consequently, it is possible to stabilize the resistivity of wiring layers 25, 36 and 42, whereby it is possible to improve the reliability of the semiconductor integrated circuit device.

Embodiment II

Figure 3:
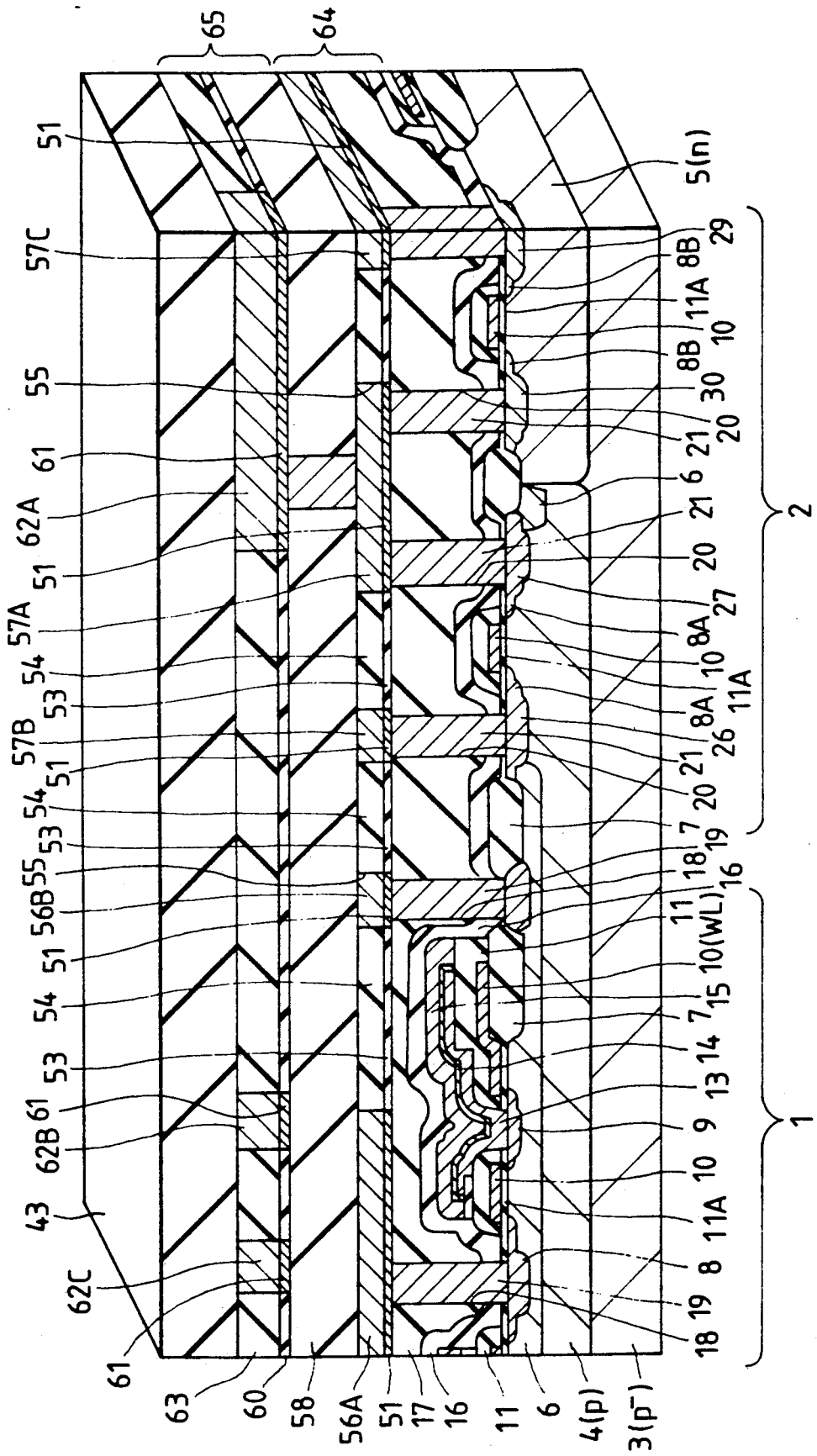
FIG. 3 is a longitudinal section view of a principal portion showing a construction of a memory cell of a DRAM according to an embodiment II of the present invention.

In FIG. 3 there is illustrated in longitudinal section a principal portion of a DRAM according to another embodiment (Embodiment II) of the present invention. The difference between this embodiment and the previous embodiment (Embodiment I) resides in the position of the base layer between each tungsten wiring layer and insulating film, and how to form it. The same components as in the embodiment I will be indicated by the same reference numerals, and detailed explanations thereof omitted.

A first inter-layer insulating film 64 used in this embodiment comprises a BPSG film 17, a silicon oxide film 53 formed flatwise thereon and formed by selective thermal oxidation of a polycrystalline silicon film 51 in other portions than the portions where wiring layers are formed, and a silicon oxide film 54 on the silicon oxide film 53.

In wiring layer-forming grooves 55, formed in predetermined positions of the silicon oxide film 54, there are embedded first tungsten wiring layers 56A, 56B, 57A to 57C so as to be substantially flush with the surface of the silicon oxide film 54.

Under each of the above tungsten wiring layers there remains a polycrystalline silicon film 51. Since polycrystalline silicon can be atomic-bonded to the tungsten wiring layers, both are held in good adhesion. How to form the polycrystalline silicon film 51 and the silicon oxide film 53 will be described later in detail, but in short the polycrystalline silicon film 51 is deposited over the whole surface of the BPSG insulating film 17 and thereafter the other portions thereof than the portions for the formation of the wiring layers are thermally oxidized to form the silicon oxide film 53.

A second inter-layer insulating film 65 comprises a silicon oxide film 58 formed on the first tungsten wiring layers 56A, 56B, 57A–57C and the silicon oxide film 54, a polycrystalline silicon film 61 which has been changed into a silicon oxide film 60 in the other portions thereof than the portions where the wiring layers are formed, and a silicon oxide film 63 formed thereon. The polycrystalline silicon film 61 forms an atomic bond to the tungsten wiring layers and functions to maintain in good adhesion between the silicon oxide film 63 and the wiring layers formed.

The manufacturing process for the tungsten wiring layers in the structure shown in FIG. 3 will be described below with reference to FIGS. 4(a) to 4(e). All the other steps than those about to be described are the same as in Embodiment I.

Figure 4A:
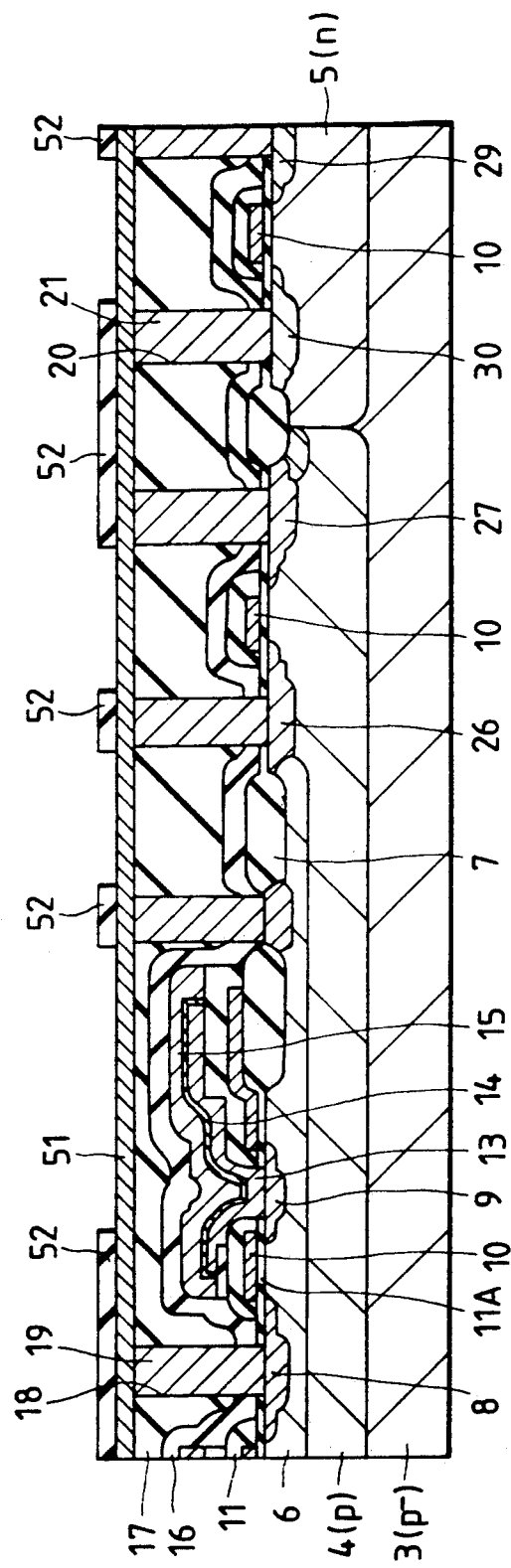
FIGS. 4(a) to 4(e) are sectional views of a principal portion, showing the memory cell of the DRAM of FIG. 3 at various stages of the manufacturing process.

First, as shown in FIG. 4(a), a polycrystalline silicon film 51 is formed on the BPSG insulating film 17 which covers the semiconductor element on the semiconductor substrate 3 and also on the tungsten electrodes 19, 21 for contact use, and a nitride film 52, which, illustratively, is a silicon nitride film, is selectively provided on the polycrystalline silicon film 51. This silicon nitride film can be selectively provided by forming a layer of the nitride (e.g., by chemical vapor deposition) and selectively removing using conventional photoresist, in a conventional photolithography technique, to mask the nitride layer, with desired portions of the nitride layer being removed, e.g., by plasma etching.

Figure 4B:
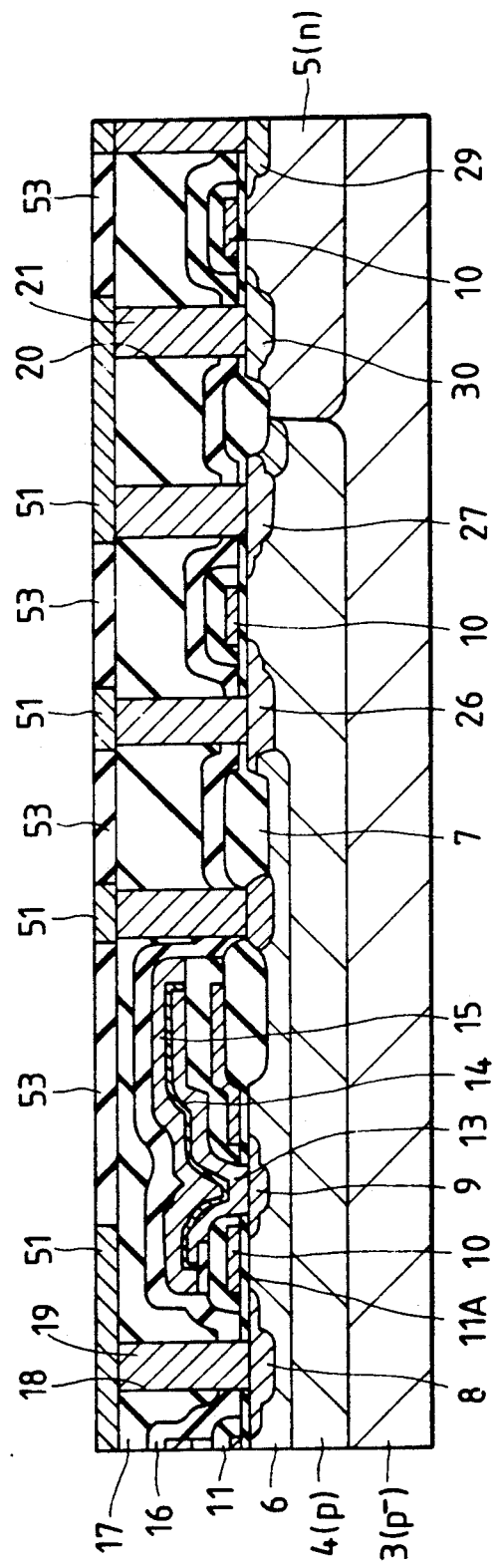
Figure 4C:
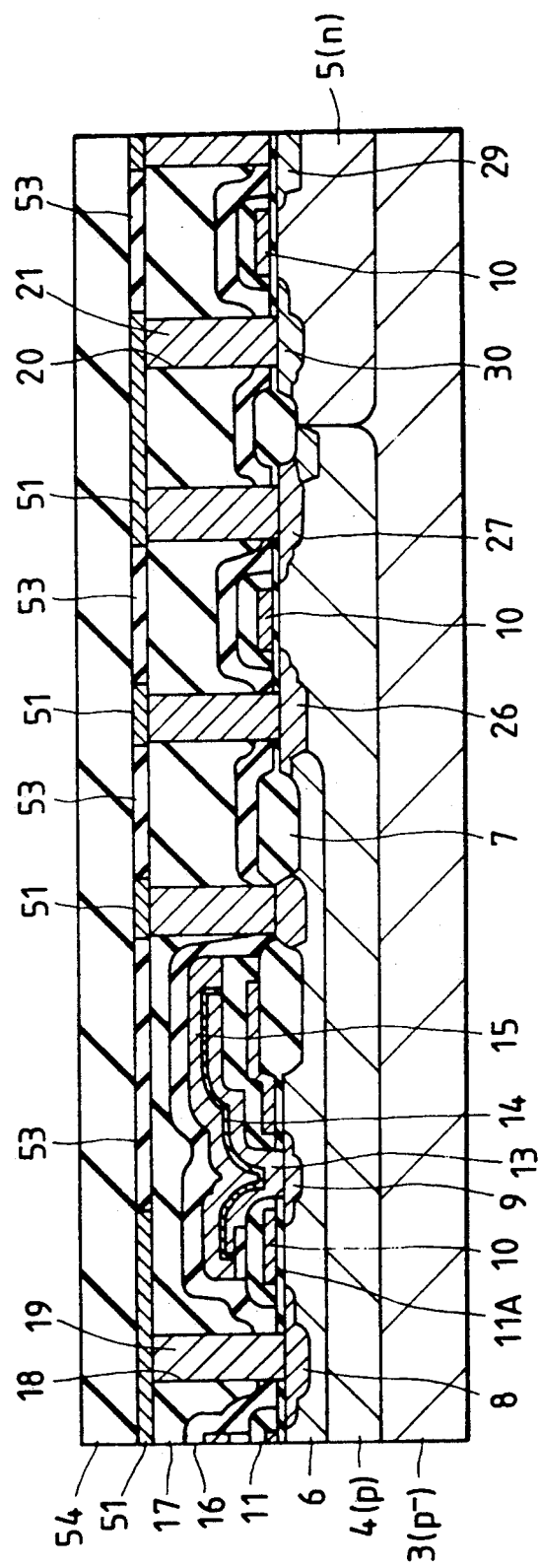
Figure 4D:
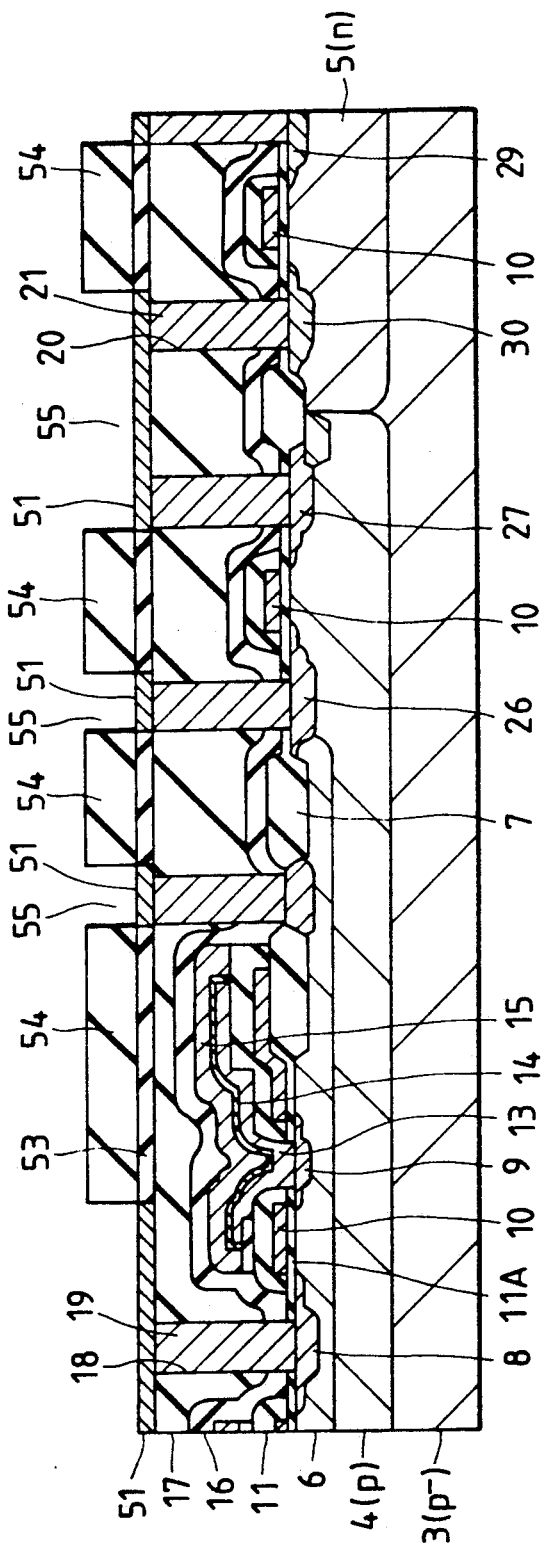
Figure 4E:
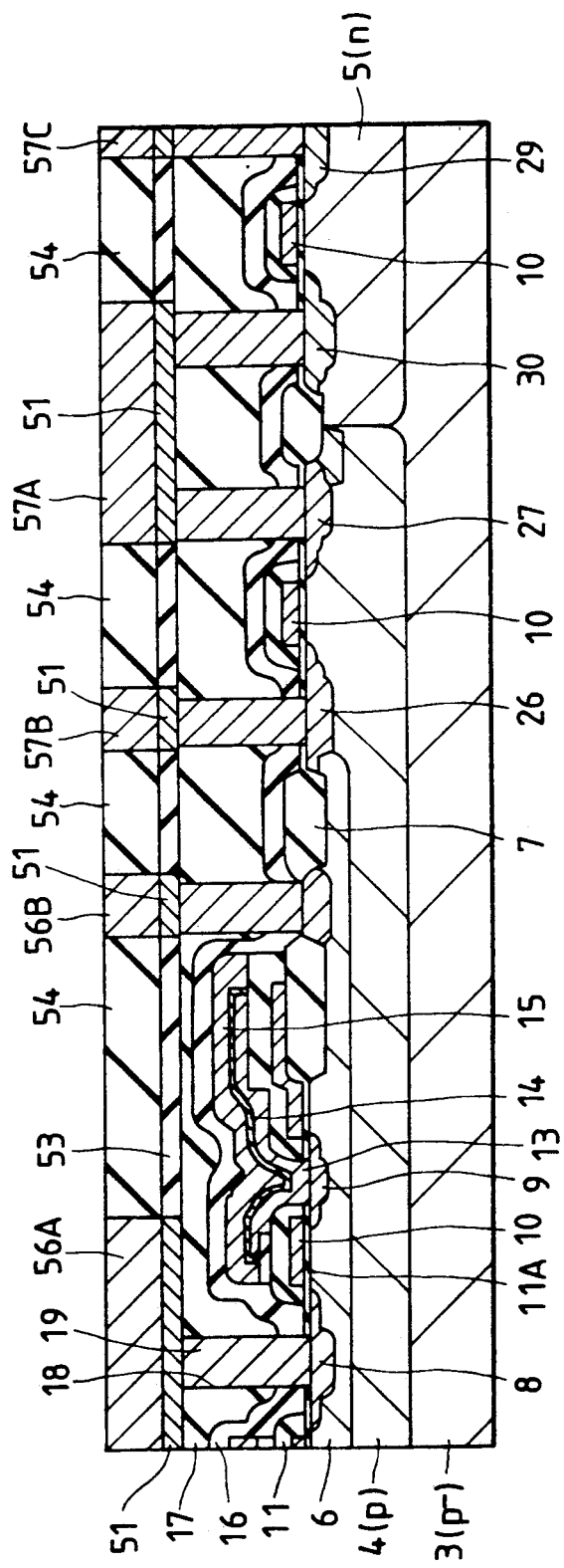

Next, as shown in FIG. 4(b), the exposed polycrystalline silicon film 51 is thermally oxidized and thereby converted to a silicon oxide film 53; thereafter the nitride film 52 is removed by anisotropic dry etching such as RIE. Then, as shown in FIG. 4(c), a silicon oxide film 54 is formed, e.g. by chemical vapor deposition. Next, as shown in FIG. 4(d), predetermined portions of the silicon oxide film 54 are removed to form wiring layer-forming grooves 55. The predetermined portions of silicon film 54 are removed by providing a mask on the portions of the silicon oxide film 54 which are not to be removed (e.g., by conventional photolithography, using conventional photoresist), and then removing, e.g., by anisotropic dry etching, the film portions not covered by the mask. Then, as shown in FIG. 4(e), tungsten is deposited on the wiring layer-forming grooves 55 by the selective CVD method to form first tungsten wiring layers 56A, 56B, 57A-57C. Further, after forming a silicon oxide film 58 by the same method as in the embodiment I, there are formed an inter-layer insulating film 65 and second tungsten wiring layers 62A-62C in the same manner as in the formation of the first inter-layer insulating film and first tungsten wiring layers described in the embodiment I.

According to the above embodiment II there can be obtained the following effects in addition to the same effects as in the embodiment I.

Since the polycrystalline silicon films 51 and 61 are formed under the tungsten wiring layers 56A, 56B, 57A-57C and 62A-62C, adhesion to the BPSG film 17 and the silicon oxide film 58 is improved to the extent of eliminating fear of exfoliation. Moreover, for example, when a power wiring having a large width is formed on the same inter-layer insulating film as that for signal wiring, it is possible to positively effect the formation of the wiring layer.

In comparison with the embodiment I, the number of steps is large and photoetching is required twice for forming a single wiring layer, so it must be taken into account that optical accuracy is required.

Although the present invention has been described above concretely in terms of embodiments, it goes without saying that the present invention is not limited thereto and that various modifications may be made within the scope of the present invention while not departing from the gist of the invention.

For example, although in the embodiment I tungsten was used as the material of the wiring layers 25A, 25B, 36A-36C, 42A-42C and electrodes 19, 21, 37, the said material is not always limited to tungsten. For example, molybdenum may also be used for the wiring layers. These materials for the wiring layers are illustrative for the present invention, and are not limiting. Where the selective CVD method is adopted, there may be used a material capable of being deposited on metal or a silicide thereof.

The material of the base layers 24 and 41 for selective deposition thereon of the wiring layers 25A, 25B, 36A-36C, 42A-42C is not limited to the tungsten silicide used in the embodiment I or the polycrystalline silicon used in the embodiment II. For example, an amorphous silicon on which a wiring metal may be deposited, may be used as a material which exhibits good adhesion to the insulating films 22, 23, 39, 40, 51 and 61. Other materials which exhibit good adhesion to the insulating films 22, 23, 39, 40, 51 and 61, such as molybdenum silicide or other silicide, may also be used. These materials exhibiting good adhesion are illustrative, and are not limiting of the present invention. It is also possible to use in combination the tungsten silicide used in the embodiment I and the polycrystalline silicon used in the embodiment II.

Further, the material of the insulating film 17 is not always limited to BPSG used in the above embodiments. There may be used a PSG film not containing boron. The surface of the PSG film can be flattened by annealing at a temperature not lower than 1,200° C.

The material of the portion of the inter-layer insulating film in which are formed the wiring layer-forming grooves 32 and 45 shown in the embodiment I, is not limited to the combination of the silicon oxide insulation films 23, 40 and the nitride insulation films 22, 39. There may be used a material (or materials) which permits a relative etching. For example, phospho-silicate glass or a boron-doped phospho-silicate glass may be used as material of the inter-layer insulating film in which are formed the wiring layer-forming grooves, e.g., where such insulating film is formed by a three-layer structure. For example, the inter-layer insulating film can be constituted by a three-layer structure of phospho-silicate glass/silicon nitride/silicon oxide.

Although in the above embodiments there was adopted a two-layer interconnection structure, also in three- or more-layer interconnection structures there can be attained the same effects by repeating the foregoing steps.

Moreover, although in the above embodiments the present invention was described mainly with respect to its application to a DRAM, the invention is not limited thereto, but is widely applicable to various semiconductor integrated circuits, including (but not limited to) semiconductor memories, e.g. SRAM (Static-Random-Access-Memory), and data processing LSI's, e.g. microcomputers. The present invention is applicable at least under the condition that wiring layers should be formed in grooves which have been formed beforehand in an inter-layer insulating film.

While we have shown and described several embodiments in accordance with the present invention, it is understood that the same is not limited thereto, but is susceptible of numerous changes and modification as known to those skilled in the art. Therefore, we do not wish to be limited to the details shown and described herein, but intend to cover all such changes and modifications as are encompassed by the scope of the appended claims.

What is claimed is:

1. A semiconductor integrated circuit device comprising:
    a semiconductor substrate having a surface;
    an inter-layer insulating film covering the surface of said semiconductor substrate, said inter-layer insulating film having a top surface, said inter-layer insulating film having at least a first insulating layer and a second insulating layer, the first insulating layer being closer to said surface of the substrate than is the second insulating layer, the second insulating layer being positioned on the first insulating layer, the first insulating layer including a silicon oxide film and the second insulating layer including a silicon nitride film, the silicon nitride film having a thickness of 500-1500 Å and the silicon oxide film having a thickness of 0.5-15μ, said inter-layer insulating film having a wiring layer-forming groove formed therein extending in the second insulating layer from the top surface of the inter-layer insulating film, the first insulating layer being made of a different insulating material than insulating material of which the second insulating layer is made; and
    a wiring layer formed in said wiring layer-forming groove and having a top surface furthest from the surface of the substrate, with the top surface of the wiring layer being in substantially a same plane as said top surface of said inter-layer insulating film.

2. A semiconductor integrated circuit device according to claim 1, wherein said wiring layer-forming groove extends entirely through the second insulating layer.

3. A semiconductor integrated circuit device according to claim 1, wherein said wiring layer in said wiring layer-forming groove is a metal layer formed by a selective chemical vapor deposition.

4. A semiconductor integrated circuit device according to claim 3, wherein the metal of said metal layer formed by the selective chemical vapor deposition is tungsten.

5. A semiconductor integrated circuit device according to claim 4, wherein a base layer is provided on at least part of the interior of the wiring layer-forming groove, and wherein said base layer is a tungsten silicide film.

6. A semiconductor integrated circuit device according to claim 5, wherein said base layer is provided on sides of the wiring layer-forming groove.

7. A semiconductor integrated circuit device according to claim 6, wherein said third insulating layer has a film thickness greater than that of said silicon nitride film.

8. A semiconductor integrated circuit device according to claim 1, wherein the wiring layer-forming groove is a groove formed by etching a material of the second insulating layer using an etchant, the groove having a depth, and wherein the first insulating layer is made of a material etched by said etchant at a lower speed than the etching speed, by said etchant, of the material of the second insulating layer, whereby the depth of the wiring layer-forming groove can be defined by a depth of a bottom surface of the material of the second insulating film at a location of the wiring layer-forming film, said bottom surface being a surface of the material of the second insulating layer closest to the substrate.

9. A semiconductor integrated circuit device according to claim 8, wherein the wiring layer-forming groove extends entirely through the second insulating layer while substantially not extending into the first insulating layer, and wherein the depth of the wiring layer-forming groove is defined by a depth of the bottom surface of the material of the second insulating layer, at the location of a wiring layer-forming groove.

10. A semiconductor integrated circuit device according to claim 9, wherein the material of the first insulating layer is an etching stop material for etching of the material of the second insulating layer, using said etchant, in forming said wiring layer-forming groove.

11. A semiconductor integrated circuit device according to claim 8, comprising at least a further inter-layer insulating film, on the wiring layer and on the inter-layer insulating film, said further inter-layer insulating film having a top surface furthest from the substrate, said further inter-layer insulating including a further first insulating layer and a further second insulating layer, the further first insulating layer being closer to the substrate than the further second insulating layer and the further second insulating layer being on the further first insulating layer, with a further wiring layer-forming groove provided extending in the further inter-layer insulating film from the top surface of the further inter-layer insulating film into the further second insulating layer and a further wiring layer provided in said further wiring layer-forming groove, a top surface of the further wiring layer and the top surface of the further inter-layer insulating film being substantially in a same plane.

12. A semiconductor integrated circuit device according to claim 11, wherein the further wiring layer-forming groove does not extend completely through the further inter-layer insulating film, and further comprising a hole extending through the further inter-layer insulating film, with a further metal layer in the hole, so as to electrically connect the wiring layer and further wiring layer.

13. A semiconductor integrated circuit device according to claim 11, wherein the further wiring layer-forming groove is provided extending through the further second insulating layer and not through the further first insulating layer, the further wiring layer-forming groove being a groove formed by etching material of the further second insulating layer at a location of the further wiring layer-forming groove, with an etchant, and wherein material of the further first insulating layer is etched by said etchant at a lower speed than the etching speed, by said etchant, of the material of the further second insulating layer.

14. A semiconductor integrated circuit device according to claim 8, wherein said wiring layer-forming groove does not extend through the first insulating layer, and wherein the first insulating layer has a hole extending therethrough, and a metal layer is located in said hole for contact with said wiring layer.

15. A semiconductor integrated circuit device according to claim 14, wherein said metal layer in said hole is a tungsten layer, formed by selective chemical vapor deposition.

16. A semiconductor integrated circuit device according to claim 14, wherein said semiconductor substrate has semiconductor regions, of semiconductor elements of the semiconductor integrated circuit device, provided therein, and the hole extends so as to electrically connect the metal layer in the hole to a semiconductor region of a semiconductor element of the semiconductor integrated circuit device.

17. A semiconductor integrated circuit device according to claim 8, wherein a base film is provided on at least part of the interior of said wiring layer-forming groove to enhance adhesion between said wiring layer and said inter-layer insulating film.

18. A semiconductor integrated circuit device according to claim 17, wherein said base film is provided on side walls of the groove.

19. A semiconductor integrated circuit device according to claim 18, wherein the base film provided on side walls of the groove is made of tungsten silicide.

20. A semiconductor integrated circuit device according to claim 17, wherein said base film is provided on the bottom of the groove.

21. A semiconductor integrated circuit device according to claim 20, wherein the base film provided on the bottom of the groove is a polycrystalline silicon film.

22. A semiconductor integrated circuit device according to claim 21, wherein the inter-layer insulating film includes a silicon oxide film located at sides of the polycrystalline silicon film.

23. A semiconductor integrated circuit device according to claim 22, wherein said silicon oxide film located at sides of the polycrystalline silicon film is a silicon oxide film formed by thermal oxidation of portions of an initial polycrystalline silicon film, remaining portions of said initial polycrystalline silicon film constituting the polycrystalline silicon film of the base film.

24. A semiconductor integrated circuit device comprising:
a semiconductor substrate having a surface;

an inter-layer insulating film covering the surface of said semiconductor substrate, said inter-layer insulating film having a top surface, said inter-layer insulating film having at least a first insulating layer and a second insulating layer, the first insulating layer being closer to said surface of the substrate than is the second insulating layer, the inter-layer insulating film further having a third insulating layer, the second insulating layer being positioned on the first insulating layer, and the third insulating layer being formed on the second insulating layer, the first insulating layer including a silicon oxide layer having a thickness of 0.5–15μ, the second insulating layer including a silicon nitride layer having a thickness of 500–1500 Å, and the third insulating layer including a silicon oxide layer having a thickness of 0.5–1μ, said inter-layer insulating film having a wiring layer-forming groove formed through the second and third insulating layers from the top surface of the inter-layer insulating film, the first insulating layer being made of a different insulating material than insulating material of which the second insulating layer is made; and a wiring layer formed in said wiring layer-forming groove and having a top surface furthest from the surface of the substrate, with the top surface of the wiring layer being in substantially a same plane as said top surface of said inter-layer insulating film.

25. A semiconductor integrated circuit device comprising:

a semiconductor substrate having a surface;

an inter-layer insulating film which covers the surface of said semiconductor substrate, said inter-layer insulating film having at least a first insulating layer and a second insulating layer, the first insulating layer being closer to said surface of the substrate than the second insulating layer, the second insulating layer being positioned on said first insulating layer, the first insulating layer including a silicon oxide film and the second insulating layer including a silicon nitride film, the silicon nitride film having a thickness of 500–1500 Å and the silicon oxide film having a thickness of 0.5–15μ, the inter-layer insulating film having a top surface, said inter-layer insulating film having a wiring layer-forming groove extending from the top surface of the inter-layer insulating film, the wiring layer-forming groove being a groove formed by etching using an etchant, with material of said first insulating layer being a material that is etched at a lower etching speed by said etchant than the etching speed, by said etchant, of material of said second insulating layer, whereby a depth of said wiring layer-forming groove is defined by a depth of said second insulating layer of said inter-layer insulating film; and a wiring layer in said wiring layer-forming groove, the wiring layer having a top surface furthest from the substrate, the top surface of said wiring layer and said top surface of said inter-layer insulating film being in substantially a same plane, said wiring layer being a layer formed by a selective chemical vapor deposition method.

26. A semiconductor integrated circuit device according to claim 25, wherein said wiring layer-forming groove extends through an entire thickness of the second insulating layer.

27. A semiconductor integrated circuit device comprising:

a semiconductor substrate having a surface;

an inter-layer insulating film covering the surface of said semiconductor substrate, said inter-layer insulating film having a top surface, said inter-layer insulating film having at least a first insulating layer and a second insulating layer, the first insulating layer being closer to said surface of the substrate than is the second insulating layer, the second insulating layer being positioned on said first insulating layer, the first insulating layer including a silicon oxide film and the second insulating layer including a silicon nitride film, the silicon nitride film having a thickness of 500–1500 Å and the silicon oxide film having a thickness of 0.5–15μ, said inter-layer insulating film having a wiring layer-forming groove formed therein extending entirely through the second insulating layer, said first insulating layer further including a boron-doped phosphosilicate glass film on the silicon oxide film, said second insulating layer including a further insulating film on said silicon nitride film; and a wiring layer formed in said wiring layer-forming groove, and having a top surface furthest from the surface of the substrate, with the top surface of the wiring layer being in substantially a same plane as said top surface of said inter-layer insulating film.

28. A semiconductor integrated circuit device according to claim 27, wherein said further insulating film has a film thickness greater than that of said silicon nitride film.

29. A semiconductor integrated circuit device according to claim 28, wherein said further insulating film includes a silicon oxide film.

30. A semiconductor integrated circuit device according claim 29, wherein a depth of said wiring layer-forming groove is defined by a film thickness of said second insulating layer.

31. A semiconductor integrated circuit device comprising:

a semiconductor substrate having a surface;

an inter-layer insulating film covering the surface of said semiconductor substrate, said inter-layer insulating film having at least a first insulating layer and a second insulating layer, the first insulating layer being closer to said surface of the substrate than is the second insulating layer, the second insulating layer being positioned on said first insulating layer, the first insulating layer including a silicon oxide film and the second insulating layer including a silicon nitride film, the silicon nitride film having a thickness of 500–1500 Å and the silicon oxide film having a thickness of 0.5–15μ, said inter-layer insulating film having a wiring layer-forming groove formed therein extending entirely through the second insulating layer, said first insulating layer further including a phosphosilicate glass film on the silicon oxide film, said second insulating layer including a further insulating film on said silicon nitride film; and a wiring layer formed in said wiring layer-forming groove, and having a top surface furthest from the surface of the substrate, with the top surface of the wiring layer being in substantially a same plane as said top surface of said inter-layer insulating film.

32. A semiconductor integrated circuit device according to claim 31, wherein said further insulating film has a film thickness greater than that of said silicon nitride film.

33. A semiconductor integrated circuit device according to claim 32, wherein said further insulating film includes a silicon oxide film.

34. A semiconductor integrated circuit device according to claim 33, wherein a depth of said wiring layer-forming groove is defined by a film thickness of said second insulating layer.

* * * * *